United States Patent [19]

Dalisda

[11] Patent Number: 5,204,644
[45] Date of Patent: Apr. 20, 1993

[54] CIRCUIT ARRANGEMENT FOR DISTRIBUTING OR FOR COMBINING RADIO-FREQUENCY POWER

[75] Inventor: Uwe Dalisda, Olching, Fed. Rep. of Germany

[73] Assignee: Rohde & Schwarz GmbH & Co. KG, Fed. Rep. of Germany

[21] Appl. No.: 826,518

[22] Filed: Jan. 27, 1992

[30] Foreign Application Priority Data

Jan. 31, 1991 [DE] Fed. Rep. of Germany ....... 4102930

[51] Int. Cl.⁵ ............................................. H01P 5/12
[52] U.S. Cl. ..................................... 333/127; 333/136
[58] Field of Search ............... 333/100, 124, 127, 128, 333/136

[56] References Cited

U.S. PATENT DOCUMENTS 3,146,409  8/1964  Lalmond ......................... 333/100 X
5,068,630  11/1991  Gris ..................................... 333/100

FOREIGN PATENT DOCUMENTS 2733888  10/1983  Fed. Rep. of Germany .
3527555  2/1987  Fed. Rep. of Germany .

OTHER PUBLICATIONS

NTZ paper, 1962, No. 5, pp. 223–230.

*Primary Examiner*—Paul Gensler
*Attorney, Agent, or Firm*—Hill, Steadman & Simpson

[57] ABSTRACT

In a circuit arrangement for distributing radio-frequency power supplied from a summation port to a plurality of single-ports, or for combining in a summation port radio-frequency power supplied from single-ports, the absorption resistance which is active between the single-ports is constituted by an absorption resistor coupled to ground and connected to the single-ports via a three-port network, the three-port network being designed so that within the operating frequency range the signals to the two input ports thereof are in phase opposition at the common output port.

10 Claims, 1 Drawing Sheet

CIRCUIT ARRANGEMENT FOR DISTRIBUTING OR FOR COMBINING RADIO-FREQUENCY POWER

BACKGROUND OF THE INVENTION

1. Field of the Invention

The present invention is directed to a circuit arrangement for distributing to a plurality of single-ports radio-frequency power supplied to a summation port or for combining in a summation port radio-frequency power supplied from single-ports.

2. Description of the Prior Art

Circuit arrangements of the above-specified kind are known as bridge circuits or Wilkinson couplers (for instance according to an article in NTZ 1962, No. 5, pp. 223–230, or German reference 2,733,888). In the field of electronic engineering they are mainly used for connecting radio-frequency transmitters in parallel. It is also known to construct such Wilkinson couplers either wholly or in part of lumped elements such as coils and capacitors, and it is further known simultaneously to design these lumped elements of the Wilkinson coupler, which simulate the line sections, as a filter circuit and to dimension them in such a way that they will simultaneously act as radio-frequency filters in a signal conditioning branch (German reference 3,527,555). All of these known circuit arrangements require additional absorption resistors. Both in the bridge circuits and the Wilkinson couplers the required additional absorption resistors must be connected at a high voltage level between single-ports, and they must be capable of absorbing the differential power which may occur in case of possible errors in magnitude and/or phase of the radio-frequency power which is fed at the same frequency. The connection of the absorption resistor in symmetry with ground potential has several drawbacks; under all operating conditions the terminals of the resistor have a potential to ground, the resistor must be connected direct to the input of the circuit arrangement so that its position is fixed, and the terminal inductances furthermore result in the input resistance of the circuit becoming unbalanced. For the parallel connection of high-capacity radio-frequency transmitters this absorption resistor must be dimensioned correspondingly large which results in a high thermal load on an extremely small area.

SUMMARY OF THE INVENTION

The present invention overcomes the drawbacks of the prior art in a circuit arrangement for distributing to a plurality of singleports radio-frequency power supplied to a summation port or for combining in a summation port radio-frequency power supplied from single-ports. The circuit arrangement of the present invention has an absorption resistor having its one side connected to ground and being coupled to the single-ports via a three-port network. The three-port network is configured such that within the operating frequency range the signals of the two input ports are in phase opposition at the common output port.

In an advantageous development of the present invention the three-port network is composed of a low-pass filter coupled between one input port and the output port, and of a high-pass filter coupled between the other input port and the output port. Also, an additional transformation four-port network can be disposed between the junction of the high-pass filter and the low-pass filter and the output port. The input resistance of the three-port network between the input ports thereof corresponds to the value of the respective required absorption resistance. The value of the absorption resistor connected to the output port of the three-port network can be selected as required. Furthermore, the absorption resistor can be coupled to the output port of the three-port network via a coaxial cable of any desired length.

The provision of the absorption resistor according to the present invention is not fixed in respect of its location, it may be located anywhere along a coaxial cable of any given length. This permits the realization of any desired absorption capacity because the resistor may be optimally cooled due to the fact that is not restricted to any location. Also, power losses due to parasitic capacitances are not a problem, and the resistance of the absorption resistor can be selected as required. The circuit arrangement according to the present invention is predominantly advantageous for the parallel connection of two or more radiofrequency transmitters, for instance to a common antenna. However, due to the advantageous properties of the present invention it is as well suited for the distribution of radio-frequency power to a plurality of single-ports.

BRIEF DESCRIPTION OF THE DRAWINGS

The features of the present invention are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENTS

Figure 1:
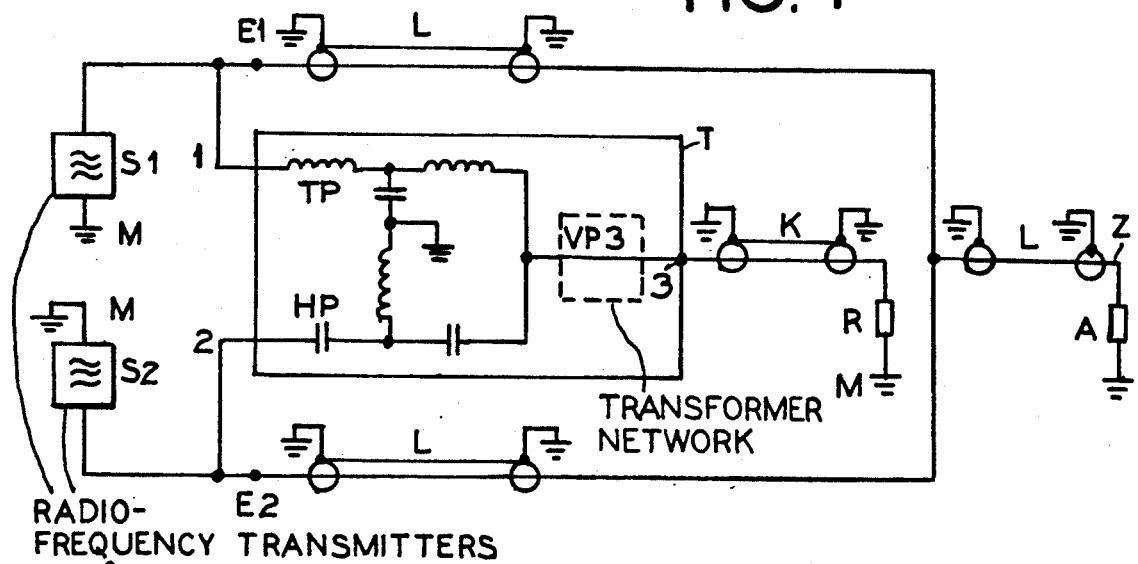
FIG. 1 is a circuit diagram of a dual-type Wilkinson coupler with a three-port network of the present invention.

FIG. 1 is a basic circuit diagram of a dual-type Wilkinson coupler which is constituted of three line transformer elements L of $\lambda/4$-length each and is used for combining the radio-frequency power from the two radio-frequency transmitters S1 and S2 of equal power and equal frequency in a common antenna. In FIG. 1 the antenna is represented by load A having a characteristic impedance Z. The absorption resistor provided in such Wilkinson couplers between the circuit points 1 and 2 is replaced in accordance with the instant invention by a three-port network T at the output port 3 of which an absorption resistor R is coupled to ground M. The three-port network T is configured and dimensioned such that the currents supplied at equal frequency to the two input ports 1 and 2 from the radio-frequency transmitters S1 and S2, that are operating in phase, are opposite in phase at the common output port 3, so that they cancel out each other at the output port 3, provided the power of the radio-frequency transmitters S1 and S2 is identical. It is only when the magnitude and/or phase of the currents fed to the input ports 1 and 2 differ from each other due to a difference in power of the two radiofrequency transmitters S1 and S2 that the currents which are in phase opposition can no longer cancel each other out so that the differential power will be absorbed in the absorption resistor R. Furthermore, the three-port network T is dimensioned such that this desired phase opposition between the input ports 1 and 2 and the common output port 3 is respectively ensured throughout the operating frequency range of the transmitters S1 and S2 between a lower frequency f1 and an upper f2.

Figure 2:
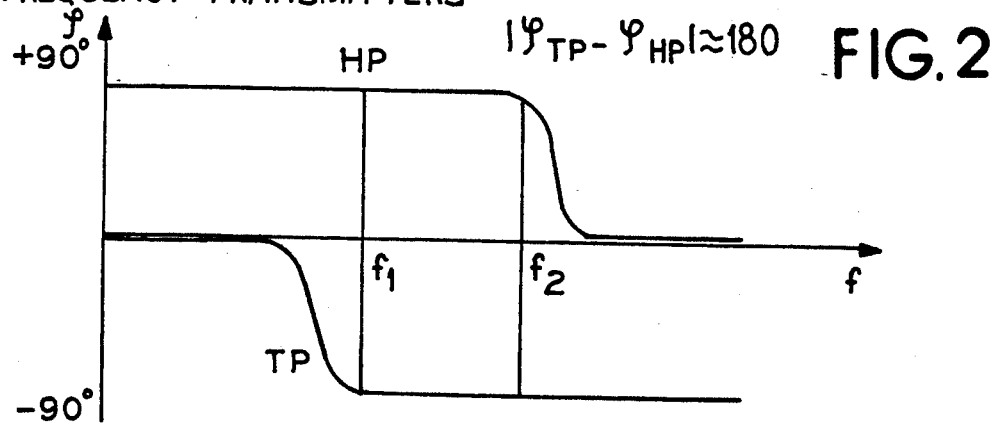
FIG. 2 is a phase response graph of the FIG. 1 three-port network.

The desirable phase opposition in the three-port branches may be achieved, for example, by corresponding low-loss delayed monostable elements, but it is preferred to provide differently dimensioned filter circuits. In the illustrated embodiment the three-port network T is composed of a multi-element high-pass filter circuit HP and a multi-element low-pass filter circuit TP. As will be apparent from FIG. 2, the critical frequencies f1 and f2 of these two filters HP and TP are respectively selected so that the corresponding phase responses within the predetermined operating frequency range between f1 and f2 are out of phase by 90° so that the high-pass HP produces a +90° phase displacement and the low-pass TP produces a corresponding −90° phase displacement. This ensures that the signals fed to the input ports 1 and 2 will be in phase opposition at the junction or output port 3. FIG. 2 shows the phase responses of simple high-pass and low-pass filters HP and TP, respectively; steeper multi-element filter circuits of the kind illustrated in FIG. 1 basically exhibit similar phase responses in phase opposition. By means of corresponding dimensioning of the critical frequencies and of the components it is also possible with such multi-element filters to maintain the relationship of phase opposition specified in FIG. 2 at the output port 3 within the predetermined operating frequency range from f1 to f2, for example in the VHF range between 70 and 150 MHz.

Furthermore, the two filters TP and HP are dimensioned so that the input resistance between the two input ports 1 and 2 corresponds to the resistance which should be active as an absorption resistance in such Wilkinson couplers between the two transmitters S1 and S2, for example 100 ohms. Since it is preferred to use a 50-ohm resistor as the absorption resistor R at the output port 3 of the three-port network T, the filters HP and TP may additionally be dimensioned so that the desired resistance transformation is provided from input to output. The absorption resistor R may be connected to the output port 3 of the three-port network T via a coaxial cable K of any required length. Hence, the resistor R can be installed at any point where the best possible cooling is available. It is merely required that there should be matching between output port 3 and the cable K and between absorption resistor R and the cable K, respectively.

If the required matching of the input resistance cannot be achieved by proper dimensioning of the filters HP and TP, an additional transformer four-port network, VP3 may be coupled between the junction of the two filters HP and TP and the output port 3 to ensure that the desired resistance transformation is maintained throughout the operating frequency range.

Figure 3:
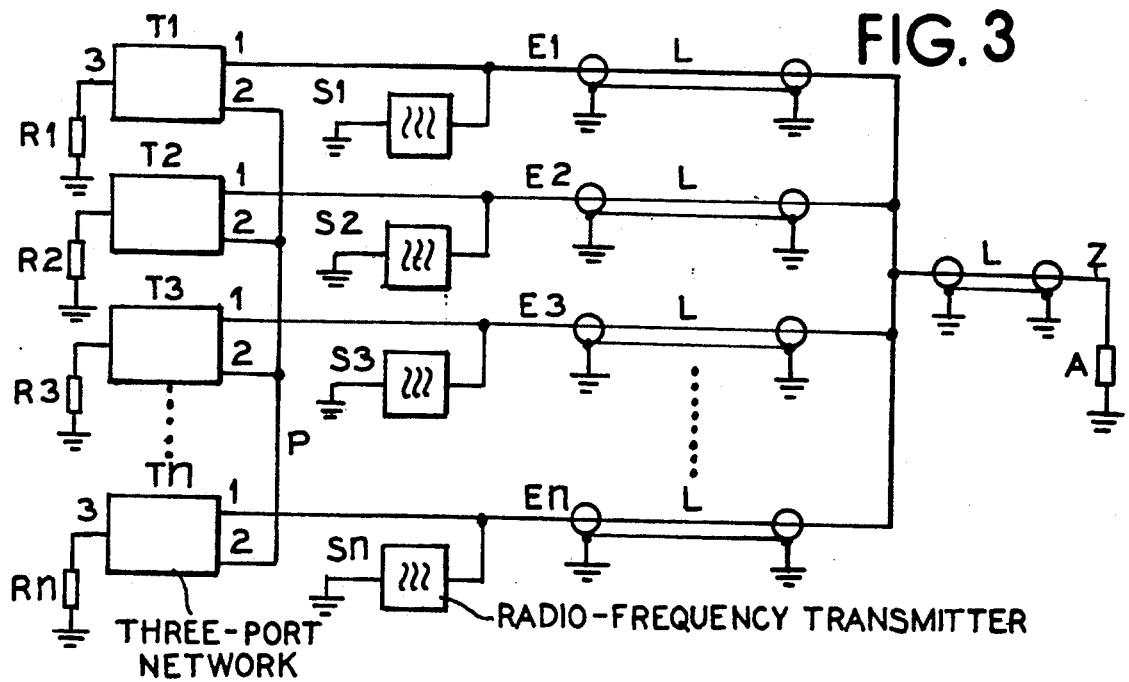
FIG. 3 is a circuit diagram of a multiple Wilkinson coupler according to the present invention.

FIG. 3 illustrates a multiple Wilkinson coupler for combining the output power of a plurality of radio-frequency transmitters Sl to Sn operating at the same frequency, the coupler being again composed of line transformation elements L. In such a circuit arrangement the absorption resistors are combined in a common summing point. In this embodiment the absorption resistors are likewise constituted by three-port networks T1 to Tn, the outputs of which have a respective absorption resistor R1 to Rn coupled thereto. One input port 1 of the three-port networks T1 to Tn is respectively coupled to one of the transmitters S1 to Sn while the other input ports 2 of all three-port networks T1 to Tn are combined in the summation point P. The input resistances of these three-port networks T1 to Tn are again dimensioned in accordance with the known dimensioning rules for such multiple Wilkinson couplers, for example 50 ohms for connection to a respective star point. The value of the absorption resistors R1 to Rn may again be selected as required, and again these resistors may be coupled via random-length coaxial cables to the outputs of the three-port networks, T1 to Tn, which again means that they may be installed where desired.

The invention is not limited to the particular details of the apparatus depicted and other modifications and applications are contemplated. Certain other changes may be made in the above described apparatus without departing from the true spirit and scope of the invention herein involved. For example, in order to distribute radio-frequency power to a plurality of single-ports as referred to above, the load or antenna A in FIG. 1 is replaced by a transmitter and the transmitters S1 and S2 are replaced by separate loads. It is intended, therefore, that the subject matter in the above depiction shall be interpreted as illustrative and not in a limiting sense.

What is claimed is:

1. A circuit arrangement for distributing to a plurality of single-ports radio-frequency power supplied to a summation port or for combining in a summation port radio-frequency power supplied from single-ports, the circuit arrangement comprising: an absorption resistor having one terminal connected to ground and having another terminal coupled to the single-ports via a three-port network, said three-port network having first and second input ports connected to respective single-ports of the plurality of single-ports and having a common output port coupled to said another terminal of said absorption resistor and said three-port network having an operating frequency range such that signals that are substantially in phase at the first and second input ports are substantially in phase opposition at the common output port at least within the operating frequency range.

2. The circuit arrangement as claimed in claim 1, wherein the three-port network is composed of a low-pass filter coupled between one of the first and second input ports of the three-port network and the common output port of the three-port network, and of a high-pass filter coupled between the other of the first and second input ports of the three-port network and the common output port of the three-port network.

3. The circuit arrangement as claimed in claim 2, wherein a transformation four-port network is connected between a junction of the high-pass filter and the low-pass filter and the common output port.

4. The circuit arrangement as claimed in claim 1, wherein an input resistance of the three-port network between the first and second input ports thereof corresponds to a value of a respective required absorption resistance.

5. The circuit arrangement as claimed in claim 1, wherein the absorption resistor is coupled to the common output port of the three-port network via a coaxial cable of unrestricted length.

6. A circuit arrangement for distributing to a plurality of single-ports radio-frequency power supplied to a summation port or for combining in a summation port radio-frequency power supplied from single-ports, the circuit arrangement comprising:
   a three-port network having first and second ports connected to respective single-ports of the plurality of single-ports and having a third port;
   an absorption resistor having a first terminal connected to ground and having a second terminal coupled to said third port of said three-port network;
   said three-port network having an operating frequency range and having a first filter between said first port and said third port and a second filter between said second port and said third port, and at least within said operating frequency range, one of said first and second filters producing a substantially +90° phase displacement and the other of said first and second filters producing a substantially −90° phase displacement.

7. The circuit arrangement as claimed in claim 6, wherein the first filter is a low-pass filter and the second filter is a high-pass filter.

8. The circuit arrangement as claimed in claim 6, wherein an additional transformation four-port network is connected between a junction of the first and second filters and the third port.

9. The circuit arrangement as claimed in claim 6, wherein an input resistance of the three-port network between the first and second ports thereof corresponds to a value of a respective required absorption resistance.

10. The circuit arrangement as claimed in claim 6, wherein the absorption resistor is coupled to the third port of the threeport network via a coaxial cable of unrestricted length.

* * * * *